United States Patent [19]

Leidich

[11] Patent Number: 4,847,518
[45] Date of Patent: Jul. 11, 1989

[54] CMOS VOLTAGE DIVIDER CIRCUITS

[75] Inventor: Arthur J. Leidich, Flemington, N.J.

[73] Assignee: Harris Semiconductor Patents, Inc., Melbourne, Fla.

[21] Appl. No.: 120,422

[22] Filed: Nov. 13, 1987

[51] Int. Cl.[4] .......................... H03K 5/08; H02M 3/06; H02M 3/135

[52] U.S. Cl. .................. 307/296.1; 307/264; 307/491; 307/568

[58] Field of Search .................. 307/264, 296 R, 297, 307/491, 501, 568

[56] References Cited

U.S. PATENT DOCUMENTS

| | | | |
|---|---|---|---|
| 3,603,811 | 9/1971 | Day et al. | 307/568 |
| 3,831,041 | 8/1974 | Krambeck et al. | 307/297 |
| 4,663,584 | 5/1987 | Okada et al. | 307/296 R |

Primary Examiner—John Zazworsky
Attorney, Agent, or Firm—H. I. Shanzer; W. J. Shanley

[57] ABSTRACT

A CMOS fractional reference source or voltage divider circuit includes a string (chain) of CMOS pairs of transistors connected with their source-drain circuits in series and with ends of the string being connected across an input power (voltage) supply. The P-channel transistors are all matched to one another in a one to one ratio, the N-channel transistors are all similarly matched to one another. Output terminals are connected at the nodes between pairs of transistors. Accurate tracking of the voltage of the power supply is achieved by connecting each gate of the chain in a manner to insure the same source-to-gate voltage on each transistor of the pair. In the preferred form, the string comprises two pairs of CMOS transistors and the voltage appearing at the output terminal thereof is equal to one half of the voltage of the power supply.

19 Claims, 2 Drawing Sheets

CMOS VOLTAGE DIVIDER CIRCUITS

FIELD OF THE INVENTION

This invention relates to semiconductor circuits and more particularly to such circuits that are useful as voltage divider circuits.

BACKGROUND OF THE INVENTION

In various electronic systems there arises a need for a circuit that provides an output a voltage which is a prescribed fraction of the voltage of an input source, for example one-half. This fraction should remain constant as the voltage of the input source varies for various reasons, including drift with temperature or aging.

Various circuits have been proposed for such use in the past. A simple form includes two pairs of Complementary Metal-Oxide-Silicon (CMOS) transistors connected so that the drain-source circuits of the four transistors are connected in series between opposite terminals of a power supply 15 to form a chain circuit 10 shown in FIG. 1. Circuit 10 includes P-channel Metal-Oxide-Silicon (MOS) transistor 11, N-channel MOS transistor 12, P-channel MOS transistor 13 and N-channel MOS transistor 14 serially connected in a chain or string which is connected to two terminals of power supply 15 (having an output voltage $+V1$) as shown. Moreover, each of the transistors is connected as a diode with its gate electrode shorted to its drain electrode so that it effectively acts as a resistor. In this arrangement, P-channel transistors 11 and 13 are matched to one another in a one to one ratio, and N-channel transistors 12 and 14 are similarly matched to one another. As used throughout herein, the term matched, unless qualified, will indicate a one-to-one ratio of match. Because of the symmetry, the voltage at a central output terminal 16 between transistors 12 and 13 is one half ($+V1/2$) of the power supply voltage $+V1$ applied between the two ends of the transistor chain. In addition, the output voltage appearing at terminal 16 tracks changes in the voltage $+V1$ of the power supply 15.

One problem with this circuit is that because the four transistors are serially located between the terminals of the power supply 15, if the voltage $+V1$ of the power supply 15 is less than the sum of the four threshold voltages of the four transistors, the voltage at output terminal 16 is indeterminate because one or more of the transistors may not be biased on and thus the circuit 10 is effectively an open circuit.

To avoid this problem, various modifications of this basic circuit configuration have been proposed so as to reduce the sum of the threshold voltage drops between the two power supply terminals.

FIGS. 2 and 3 show two such variations which have been developed. Circuit 20, which is shown in FIG. 2, includes two pairs of complementary transistors 21, 22, 23 and 24 which are connected to have their drain-source circuits connected in series. The sources of transistors 21 and 24 connected to a separate one of the terminals of power supply 25 which has an output voltage $+V2$. In this instance, P-channel transistor 21 and N-channel transistor 24 are connected as diodes, while N-channel transistor 22 has its gate connected to one terminal of the power supply 25 and P-channel transistor 23 has its gate connected to the other terminal of the power supply 25. Again the two P-channel transistors are matched to one another, and the N-channel transistors are also matched to one another. The output voltage of circuit 20, which is approximately one half the voltage of power supply 25, is derived at a central output terminal 26 between transistors 22 and 23. In circuit 20 the threshold voltage drop between the two terminals to the voltage supply 25 is approximately only two threshold voltages. However, because of asymmetry resulting because the top half has P-channel transistor 21 connected as a diode while the bottom half has N-channel transistor 24 so connected, the gate-to-source bias voltages on the two CMOS pairs of transistors tends to be different. This limits the range of input voltages (the voltage $+V2$ of the power supply 25) over which the output voltage (which appears at terminal 26) tracks any drifts in $+V2$. Typically, close tracking is limited to about a 5% range.

A circuit 30, which is shown in FIG. 3, includes two pairs of complementary transistors 31, 32, 33, and 34 which are connected to have their drain-source circuits connected in series. The sources of transistors 31 and 34 are connected to a separate one of terminals of power supply 35. Power supply 35 has an output voltage $+V3$. N-channel transistor 32 and P-channel transistors 33 are connected as diodes while transistors 31 and 34 have their gates connected to opposite terminals of a power supply 35 having an output voltage $+V3$. Again, the output voltage derived at an output terminal 36 of circuit 30 tracks the power supply input voltage only over a limited range because of the asymmetry.

SUMMARY OF THE INVENTION

In a preferred embodiment of the invention a chain or string of two pairs of complementary field effect transistors are used in which the gates are so connected that when coupled across a power supply, the gate-source bias voltages on all four transistors are essentially equal. In particular, in the chain or string the first transistor has its gate connected to the source of the second transistor and to a central node that serves as the output terminal, the second transistor has its gate connected to the source of the first transistor and to a first terminal of a voltage supply used with the circuit, the third transistor has its gate connected to the source of the fourth transistor and to a second terminal of the voltage supply, and the fourth transistor has its gate connected to the source of the third transistor and to the central node.

In this arrangement, the source to gate bias voltage of each transistor is essentially equal to one half the voltage of the power supply used. As a consequence, the accuracy of the output voltage relative to the (input) voltage of the power supply used, is essentially independent of the transistor parameters and operating temperatures so long as the two N-channel transistors are matched to one another and the two P-channel transistors are matched to one another.

It can also be appreciated that, as with conventional fractional source reference circuits, longer chains of complementary pairs may be used with multiple output terminals (taps).

The invention will be more fully understood from the following detailed description taken in conjunction with the accompanying drawing.

DETAILED DESCRIPTION

Figure 1:
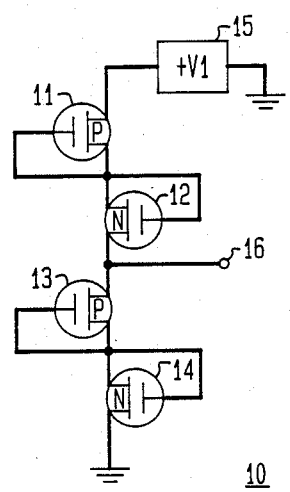
FIGS. 1–3 show the various prior art circuits previously described in the Background of the Invention.
Figure 2:
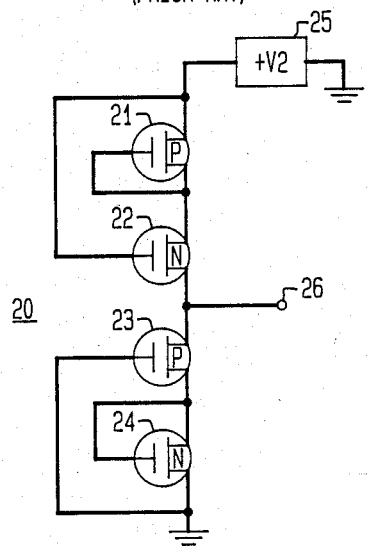
Figure 3:
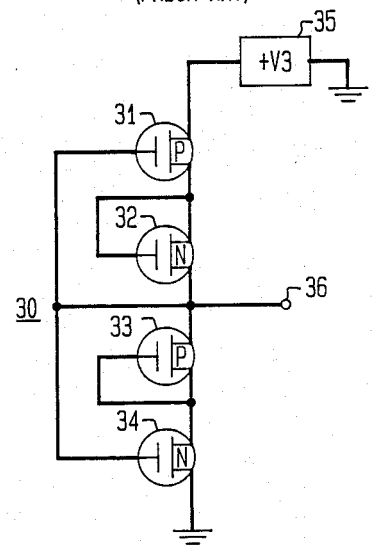
Figure 4:
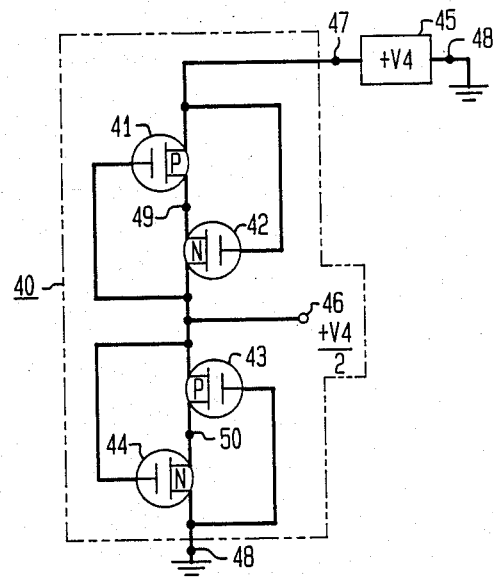
FIG. 4 shows as a preferred embodiment of the invention, a circuit including a string or chain of two pairs of complementary transistors for providing an output voltage equal to half that of the voltage of a power supply used with the circuit.

Referring now to FIG. 4, there is shown within a dashed line rectangle a voltage divider circuit 40 in accordance with a preferred embodiment of the present invention. Circuit 40 comprises N-channel field effect transistors 42 and 44 and P-channel field effect transistors 41 and 43. A positive power supply 45 having an output voltage of +V4 is coupled by output terminals 47 and 48 thereof to circuit 40. Circuit 40 functions to generate a voltage having potential of +V4/2 at an output terminal 46 thereof.

Each of the transistors has drain, source and gate electrodes. The direction of positive current flow through a field effect transistor and its conductivity type determine which of its output terminals are denoted as drain and source. Positive current flowing through an N-channel transistor flows from drain to source. In a P-channel transistor it flows from source to drain. The source of transistor 41 and the gate of transistor 42 are coupled to terminal 47. The drain of transistor 41 is coupled to the drain of transistor 42 and to a node 49. The gates of transistor 41 and 44 and the sources of transistors 42 and 43 are all coupled to output terminal 46. The gate of transistor 43 and the source of transistor 44 are coupled to terminal 48 which is shown at ground potential.

Typically P-channel transistor 41 is matched to P-channel transistor 43 and N-channel transistor 42 is matched to N-channel transistor 44. In this case the output voltage appearing at output terminal 46 is equal to one half the voltage of power supply 45. Thus with power supply 45 coupled to circuit 40, the potential appearing at output terminal 46 is +V4/2. Circuit 40 is so configured that the voltage appearing at output terminal 46 is +V4/2 even if there are variations or drifting in the magnitude of +V4.

In a typical embodiment all the transistors of circuit 40 are enhancement mode Metal-Oxide-Silicon Field Effect Transistors (MOSFETs) and the amplitude of the voltage +V4 of power supply 45 is sufficient to bias "on" all the transistors and to support conduction therethrough. The amplitude of +V4 need only be equal to the largest two threshold voltages of the four transistors of circuit 40.

Variations in semiconductor processing across a silicon chip in which circuit 40 is fabricated or mask misalignment can cause variations in the geometries of transistors which are designed to be matched in a one-to-one ratio. Circuit 40 is somewhat forgiving of mismatches of transistors in that even moderate mismatches in transistor geometry result in only a relatively minor variation in the desired output voltage. For example, with +V4=+5.0 volts and the threshold voltages of the transistors being in the one to two volt range, a thirty percent mismatch of two transistors would typically result in a less than five percent variation in the output voltage from the ideal level of +V4/2. Transistors on the same semiconductor integrated circuit chip can typically be matched within five percent and the resulting variation in output voltage is typically less than one percent.

It is to be appreciated that each of the enhancement mode transistors could have the conductivity type reversed. This would require that the potential of the power supply be reversed.

Alternatively, each of the transistors could be a depletion mode MOSFET or a Junction Field Effect Transistor (JFET) and the amplitude of the power supply would be chosen to be of a sufficient level to keep all of the transistors biased on and conducting. If a positive voltage power supply is used, as is shown in FIG. 4, the conductivity type of the depletion mode transistors and the JFETs is the reverse of what is shown in FIG. 4. If a negative voltage supply is used then the conductivity types of the depletion mode transistors and the JFETs are as is shown in FIG. 4.

Figure 5:
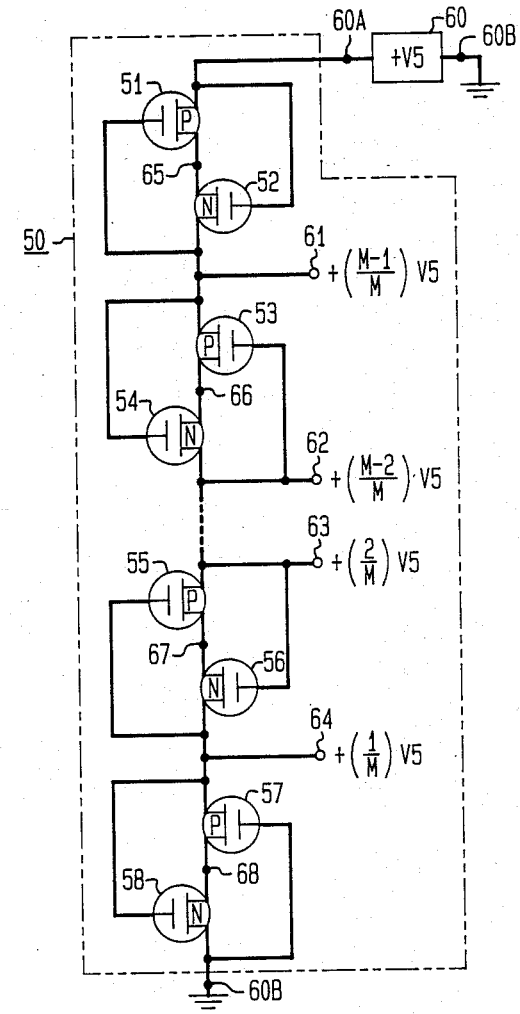
FIG. 5 shows more generally a longer chain or string of pairs of complementary transistors for providing a plurality of different fractional output voltages relative to the voltage of a power supply used with the circuit.

Referring now to FIG. 5, there is shown within a dashed line rectangle a circuit 50 in accordance with another embodiment of the present invention. Circuit 50 comprises the series combination of M complementary pairs of field effect transistors with the first pair comprising P-channel field effect transistor 51 and N-channel field effect transistor 52, the second pair comprising P-channel field effect transistor 53 and N-channel field effect transistor 54, the M−1th pair comprising P-channel field effect transistor 55 and N-channel field effect transistor 56 and the Mth pair comprising P-channel field effect transistor 57 and N-channel field effect transistor 58. The pairs of complementary transistors and their respective output terminals between the second pair and the M−1th pair are not shown but are indicated by the dashed vertical line. A positive power supply 60 having an output voltage of +V5 is coupled by output terminals 60A and 60B to circuit 50. Output terminal 60B is shown coupled to ground potential. Circuit 50 has multiple output terminals with a separate output terminal being coupled between pairs of adjacent transistors. Only output terminals 61, 62, 63 and 64 are shown. Circuit 50 functions to generate output voltages at terminals 61, 62, 63 and 64 of +[(M−1)/M](V5), +[(M−2)/M](V5), +(2/M)(V5) and +(1/M)(V5), respectively, where M is the number of pairs of complementary transistors. The output voltage appearing at successive output terminals differ by 1/M of the potential +V5 of power supply 60.

Transistors 51 and 52 comprise the first pair of complementary transistors; transistors 53 and 54 comprise the second pair of complementary transistors; transistors 55 and 56 comprise the M−1th pair of complementary transistors; and transistors 57 and 58 comprise the Mth pair of complementary transistors.

The source of transistor 51 and the gate of transistor 52 are coupled to terminal 60A. The drains of transistors 51 and 54 are coupled to a node 65. The sources of transistors 52 and 53 and the gates of transistors 51 and 54 are coupled to output terminal 61 which is shown to be at a voltage of +[(M−1)/M](V5). The source of transistor 54 and the gate of transistor 53 are shown coupled to output terminal 62 which is shown to be at a potential of +[(M−2)/M](V5). Another pair of complementary transistors, the third pair, which are not shown but are represented by the dashed vertical line between transistors 54 and 55, are also coupled to output terminal 62.

The source of transistor 55 and the gate of transistor 56 are coupled to output terminal 63 which is shown to be at a voltage of $+[(2)/M](V5)$. A preceding pair of complementary transistors, not shown but denoted by the vertical dashed line between transistors 54 and 55, is also coupled to output terminal 63. The drain of transistor 55 is coupled to the source of transistor 56 and to a node 67. The gates of transistors 55 and 58 and the sources of transistors 56 and 57 are coupled to output terminal 64 which is shown to be at potential $+(1/M)V5$. The drains of transistors 57 and 58 are coupled together to a node 68. The gate of transistor 57 is coupled to the source of transistor 58 and to output terminal 60B of power supply 60.

In the embodiment of circuit 50 above herein discussed, all of the P-channel transistors are matched to one another and all of the N-channel transistors are similarly matched. The magnitude of the power supply voltage $+V5$ is selected to be sufficient such that each of the transistors of circuit 50 is biased on and conducts.

Tracking of the voltage at the output terminals of circuit 50 is maintained because the particular configuration used insures that the source-to-gate voltage of each of the transistors is equal to $1/M$ of the voltage $+V5$ of the power supply 60.

It is to be understood that the embodiments described herein are merely illustrative of the general principles of the invention. Various modifications are possible within the scope of the invention. For example, it is feasible to use the series combination of three pair or more pairs of complementary field effect transistors to form a voltage divider circuit. Still further, the transistors can be fabricated in a silicon wafer or in the silicon epitaxial layer of a Silicon-On-Sapphire (SOS) integrated circuit. Still further, the transistors could be fabricated in a variety of different semiconductive materials such as gallium arsenide or germanium.

What is claimed is:

1. A voltage divider circuit for connection across a power supply comprising:
   a plurality of pairs of complementery field effect transistors each transistor having a source and a drain defining the ends of a conduction path and a control electrode, the transistors being connected in a string so that their separate source-drain paths form a series circuit for connection across the power supply, each of the pairs of transistors comprising an N-channel field effect transistor and a P-channel field effect transistor;
   an output node between each successive pairs of transistors where an output voltage may be abstracted; and
   for each and every pair of complementary transistors, means for connecting the gate of the first transistor of a pair and the source of the second transistor of that pair to one point of potential on the string and means for connecting the gate of the second transistor of the pair and the source of the first transistor to another point of potential on the string whereby the source-to-gate voltages of the two transistors of each pair of complementary transistors in the string are equal.

2. The voltage divider circuit of claim 1 in which there are four transistors in the string of which the two P-channel transistors are matched to one another in essentially a one to one ratio and the two N-channel transistors are matched to one another in essentially a one to one ratio and there is available one half the supply voltage at an output terminal coupled to the output node between the two pairs of complementary transistors.

3. The voltage divider circuit of claim 2 in which the first transistor of the string has its gate connected to the output terminal, the second transistor has its gate connected to one of two ends of the string, the third transistor has its gate connected to the other end of the string, and the fourth transistor has its gate connected to the output terminal.

4. The voltage divider circuit of claim 3 wherein the transistors are metal-oxide-silicon (MOS) type transistors.

5. The voltage divider circuit of claim 3 wherein the transistors are junction field effect transistors.

6. The voltage divider circuit of claim 3 wherein the transistors are silicon-on-sapphire field effect transistors.

7. The voltage divider circuit of claim 1 in which the number of pairs of complementary transistors is two or greater.

8. The voltage divider circuit of claim 7 wherein the transistors are metal-oxide-silicon (MOS) transistors.

9. The voltage divider circuit of claim 7 wherein the transistors are junction field effect transistors.

10. The voltage divider circuit of claim 7 wherein the transistors are silicon-on-sapphire field effect transistors.

11. In combination:
    first and second power terminals for the application therebetween of a source of operating potential;
    a first P-channel type field effect transistor, a second N-channel type field effect transistor, a third P-channel type field effect transistor and a fourth N-channel type field effect transistor;
    each of the transistors having a gate electrode and drain and source electrodes defining the ends of a conduction path and the source-drain paths of the first, second, third and fourth transistors being connected successively in series between said first and second power terminals;
    means connecting the gate of the first transistor to the sources of the second and third transistors;
    means connecting the gate of the second transistor to the source of the first transistor;
    means connecting the gate of the third transistor to the source of the fourth transistor;
    means connecting the gate of the fourth transistor to the sources of the second and third transistors; and
    an output terminal being coupled to the sources of the second and third transistors.

12. The combination of claim 11 wherein the first and third transistors are matched in essentially a one to one ratio, and the second and fourth transistors are matched in essentially a one to one ratio.

13. The combination of claim 12 wherein the field effect transistors are metal-oxide-silicon (MOS) type transistors.

14. The combination of claim 12 wherein the transistors are junction field effect transistors.

15. The voltage divider circuit of claim 12 wherein the transistors are silicon-on-sapphire field effect transistors.

16. In combination:
    a first field effect transistor of the first conductivity type, a second field effect transistor of the opposite conductivity type, a third field effect transistor of the first conductivity type, and a fourth field effect transistor of the opposite conductivity type;

each of the transistors having a gate and first and second output terminals;

the second output terminal of the first transistor being coupled to the first output terminal of the second transistor;

the second output terminal of the third transistor being coupled to the first output terminal of the fourth transistor;

the gate of the first transistor being coupled to the second output terminal of the second transistor and to the first output terminal of the third transistor;

the gate of the second transistor being coupled to the first output terminal of the first transistor;

the gate of the third transistor being coupled to the second output terminal of the fourth transistor;

the gate of the fourth transistor being coupled to the second output terminal of the second transistor and to the first output terminal of the third transistor;

a power supply being coupled between the first output terminal of the first transistor and the second output terminal of the fourth transistor;

an output terminal being coupled to the second output terminal of the second transistor and to the first output terminal of the third transistor; and the first and third transistors being matched in essentially a one to one ratio, and the second and fourth transistors being matched in essentially a one to one ratio.

17. The combination of claim 16 further comprising:

the first and second transistors comprise a first pair of complementary transistors and the third and fourth transistors comprise a second pair of complementary transistors; and one or more additional pairs of complementary transistors serially coupled to the first and second pairs of complementary transistors.

18. Circuitry comprising:

a plurality of pairs of complementary field effect transistors connected in a string so that their separate source-drain circuits form a series circuit which is coupled by one end thereof to a first terminal and is coupled by a second end thereof to a second terminal;

the gate of each first transistor of a pair of transistors being coupled to the source of the second transistor of that pair of transistors; and the gate of each second transistor of a pair of transistors being coupled to the source of the first transistor of that pair of transistors.

19. A voltage divider circuit comprising:

first and second power terminals for the application therebetween of a potential to be divided;

M-pairs of complementary field effect transistors, each transistor having source and drain electrodes defining the ends of a conduction path and a control electrode, each pair of transistors comprising a N and a P channel field effect transistor;

means connecting the drain of the first transistor of each pair of transistors to the drain of the second transistor of that pair of transistors, whereby the conduction paths of the two transistors of each pair are connected in series, and means connecting the control electrode of the first transistor of each pair of transistors to the source electrode of the second transistor of that pair and the control electrode of the second transistor of each pair of transistor to the source electrode of the first transistor of that pair, whereby the control electrode-to-source voltage of the first transistor of each pair equals the control electrode-to-source voltage of the second transistor of that pair; and means connecting the M pairs of complementary transistors in series between said first and second power terminals; where M is an integer greater than one (1).

* * * * *